US011540383B2

(12) United States Patent
Koyanagi et al.

(10) Patent No.: US 11,540,383 B2
(45) Date of Patent: Dec. 27, 2022

(54) SIGNAL TRANSMISSION CIRCUIT AND PRINTED CIRCUIT BOARD

(71) Applicant: Hitachi, Ltd., Tokyo (JP)

(72) Inventors: Takayuki Koyanagi, Tokyo (JP); Takemasa Komori, Tokyo (JP)

(73) Assignee: HITACHI, LTD., Tokyo (JP)

( * ) Notice: Subject to any disclaimer, the term of this patent is extended or adjusted under 35 U.S.C. 154(b) by 0 days.

(21) Appl. No.: 17/000,406

(22) Filed: Aug. 24, 2020

(65) Prior Publication Data
US 2021/0307157 A1 Sep. 30, 2021

(30) Foreign Application Priority Data

Mar. 26, 2020 (JP) .............................. JP2020-056242

(51) Int. Cl.
*H05K 1/02* (2006.01)
*H05K 1/11* (2006.01)
*H01P 3/08* (2006.01)

(52) U.S. Cl.
CPC .............. *H05K 1/0242* (2013.01); *H01P 3/08* (2013.01); *H05K 1/115* (2013.01)

(58) Field of Classification Search
CPC .......... H05K 1/0242; H05K 1/115; H01P 3/08
See application file for complete search history.

(56) References Cited

U.S. PATENT DOCUMENTS

2007/0102830 A1* 5/2007 Muto ...................... H05K 1/118
257/784
2015/0264803 A1* 9/2015 Kaikkonen .......... H05K 1/0253
361/803

2015/0370748 A1 12/2015 Wakayama et al.
2017/0062960 A1 3/2017 Becker et al.
2018/0368252 A1* 12/2018 Oguri ...................... H01P 3/081

FOREIGN PATENT DOCUMENTS

| JP | 2015507358 A | 3/2015 |
| WO | 2013103437 A1 | 7/2013 |
| WO | 2015/068225 A1 | 5/2015 |

OTHER PUBLICATIONS

Japanese Office Action received in corresponding Japanese Application No. 2020-056242 dated Nov. 2, 2021.

* cited by examiner

*Primary Examiner* — Samuel S Outten
(74) *Attorney, Agent, or Firm* — Mattingly & Malur, PC

(57) ABSTRACT

A signal transmission circuit includes a printed circuit board including a surface layer including a signal transmission path that transmits a signal, a signal line through hole that connects the signal transmission path with a signal layer arranged in an inner layer of the printed circuit board, a ground layer of the inner layer of the printed circuit board that forms a return current transmission path for the signal transmission path, and a ground through hole that is connected to the ground layer adjacent to the signal line through hole. A ground pattern including ground areas disposed with a certain distance therebetween and a side ground area connected with at least one end side of the ground areas is disposed at positions of both sides of the signal transmission path. The ground through hole is disposed to connect the ground pattern with the ground layer.

9 Claims, 25 Drawing Sheets

SIGNAL TRANSMISSION CIRCUIT AND PRINTED CIRCUIT BOARD

CROSS-REFERENCE TO RELATED APPLICATION

The present application claims priority from Japanese application JP 2020-056242, filed on Mar. 26, 2020, the contents of which is hereby incorporated by reference into this application.

BACKGROUND OF THE INVENTION

1. Field of the Invention

The present invention relates to a signal transmission circuit and a printed circuit board.

2. Description of the Related Art

Recent progress in data communication is remarkable, and the transmission speed is rapidly increasing. For example, in a PCI Express standard known as an extended bus standard specification, in PCI Express 4.0 (Gen4) established in 2017, a physical bandwidth per lane is 16 GT/s in one direction. Further, in PCI Express 5.0 (Gen5) whose standard was established in 2019, a one-way speed is 32 GT/s which is twice as fast as PCI Express 4.0 (Gen4).

In order to realize such high speed transmission (an increase in a signal transmission speed) in signal transmission on a printed circuit board, it is effective to shorten a return current path of a ground layer formed in an inner layer of a printed circuit board in which a return current flows to a signal transmission path disposed on a surface layer of the board. By shortening the return current path, appropriate impedance is obtained, and electromagnetic coupling between the signal transmission path and the return current path is controlled to thereby realize signal transmission with less noise. As a general noise countermeasure in this kind of high-speed transmission path, a ground line having a certain width is disposed on both sides of the signal transmission path (constituted by a pair of signal lines in the case of a differential scheme) with a predetermined distance with the signal transmission path, and the ground line is connected to the ground layer of the inner layer via a ground through hole to form the return current path. The connection means electrical connection. This technology is referred to as a "conventional example 1" for the sake of convenience of the following description. Incidentally, in this description, a "ground" is also abbreviated as "GND." According to the technology of the conventional example 1, it is possible to reduce the loop of the signal and the ground layer (GND layer) and maintain the return current path. Further, the technology described in WO 2015/068225 A is known as a technology that has further evolved such noise countermeasures.

In WO 2015/068225 A, improving transmission characteristics of signals by reducing a length of a return current detour path is a problem, and a configuration in which a return current transmission path is disposed for a signal transmission path for transmitting signals, the signal transmission path includes a signal pad formed on a substrate surface layer and a signal line through hole which is formed in the substrate surface layer and a substrate inner layer and connected to the signal pad, the return current transmission path includes a GND pad (a ground pad) formed on the substrate surface layer and a plurality of GND through holes which are formed in the substrate surface layer and the substrate inner layer and connected to the GND pad and the GND layer in the substrate, and the GND through holes are arranged distributedly on the both sides of the GND pad is disclosed. Hereinafter, the technology disclosed in WO 2015/068225 A is referred to as a "conventional example 2."

By the way, in a case in which high speed transmission is performed, usually, a signal transmission path of a differential scheme in which two signal lines that make a pair are arranged, and signals with opposite phases are assigned to the two signal lines and transmitted is adopted. The signal transmission path of the differential transmission scheme can increase the data transmission speed by a degree in which the signal amplitude can be made smaller than in the case of single transmission. Also, in the differential transmission scheme, since the same common noise (common mode noise) is superimposed on the opposite-phase signals, the influence thereof can be offset when a difference of a pair of signal lines is taken at the receiving end, and thus it is effective in terms of the noise countermeasures. Most of the recent input/output interfaces such as PCI Express, Serial ATA, or HDMI (a registered trademark) adopt the differential transmission scheme.

In the signal transmission path according to the differential transmission scheme, a return current is generated between differential current paths (P)-GND and between differential current paths (N)-GND, but since the direction of this current is opposite, it is offset in the ground layer (GND layer) of the inner layer. In the case of the conventional example 2 (WO 2015/068225 A) described above, in order to strengthen the path of the return current, a leader line (wiring) is disposed on both sides of the ground line (GND line), and a GND through hole connected to the GND layer of the inner layer is disposed via the leader line. Accordingly, the impedance of the GND layer in which the return current path with few detour paths is formed is reduced.

However, in the technique of the conventional example 2, there are cases in which since the return current is offset in the GND layer disposed in the inner layer of the printed circuit board, the energy is superimposed on an adjacent transmission path until the return current is offset in the GND layer, and the crosstalk noise occurs. For this reason, also in the technology of the conventional example 2, the suppression of the occurrence of crosstalk noise is not enough.

In this regard, it is an object of the present invention to provide a signal transmission circuit and a printed circuit board which are capable of reducing the crosstalk noise in the signal transmission path.

SUMMARY OF THE INVENTION

In order to achieve the above-described object, according to the present invention, as an example, provided is a signal transmission circuit including a printed circuit board including a surface layer in which a signal transmission path that transmits a signal, a signal line through hole that connects the signal transmission path with a signal layer arranged in an inner layer of the printed circuit board, and a ground through hole that is adjacent to the signal line through hole and is connected with a ground layer of the inner layer of the printed circuit board that forms a return current transmission path for the signal transmission path are formed, in which a ground pattern including ground areas disposed with a certain distance therebetween and a side ground area connected with at least one end side of the ground areas is disposed on both sides of the signal transmission path, and the ground through hole is disposed to connect the ground pattern with the ground layer.

Further, as another example of the present invention, provided is a printed circuit board including a surface layer in which a signal transmission path that transmits a signal, a signal line through hole disposed to connect one end of the signal transmission path with a signal layer of an inner layer, and a ground through hole that is adjacent to the signal line through hole and is connected with a ground layer that forms a return current circuit are disposed, in which a ground pattern including ground areas disposed with a certain distance therebetween and a side ground area connected with at least one end side of the ground area is disposed on both sides of the signal transmission path, and the ground through hole is disposed to connect the ground pattern with the ground layer.

According to the present invention, it is possible to offset the return current by a ground pattern disposed on the surface layer of the printed circuit board and reduce the crosstalk noise effectively.

DETAILED DESCRIPTION OF THE PREFERRED EMBODIMENTS

Figure 1:
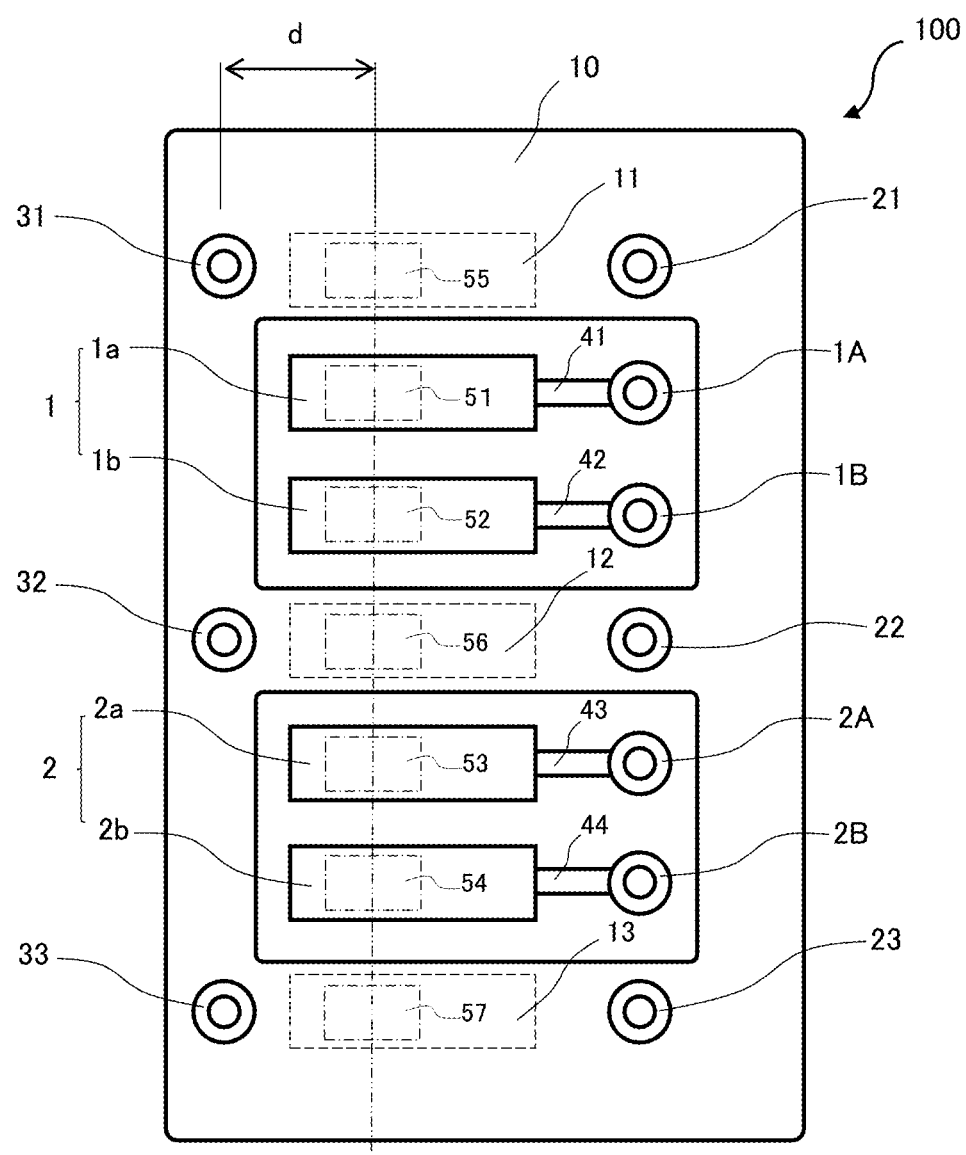
FIG. 1 is a main part plane view of a printed circuit board in which a connector is mounted according to an embodiment 1.

Hereinafter, embodiments for carrying out the present invention will be described in detail. Incidentally, the present invention is not limited to embodiments to be described below. In each of drawings used in the following description, like devices or like operations are denoted by like reference numerals or symbols, and in principle, description of devices described already is omitted. Thus, duplicate descriptions are reduced. Incidentally, in embodiments to be described below, a configuration example in which a connector with a plurality of pins is connected to a printed circuit board with a signal transmission path will be described, but the present invention is not limited to this configuration. Also, in all embodiments to be described below, an example of a signal transmission path of a differential signal scheme in which two signal lines are set as a signal path will be described, but the present invention can be applied regardless of a differential scheme or a single scheme.

Embodiment 1

Figure 2:
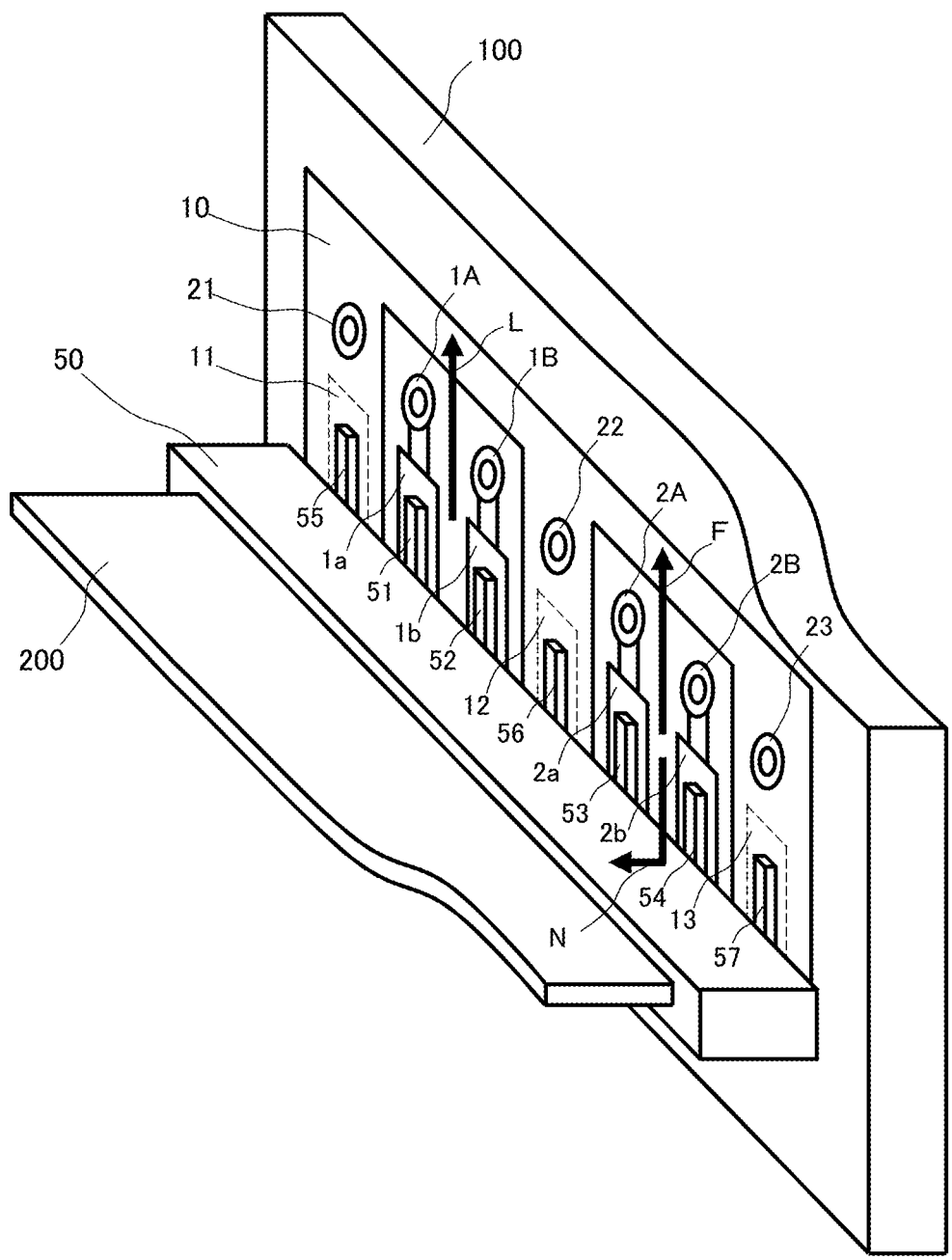
FIG. 2 is a perspective view illustrating an enlarged connection portion between a connector and a printed circuit board according to an embodiment 1.
Figure 3:
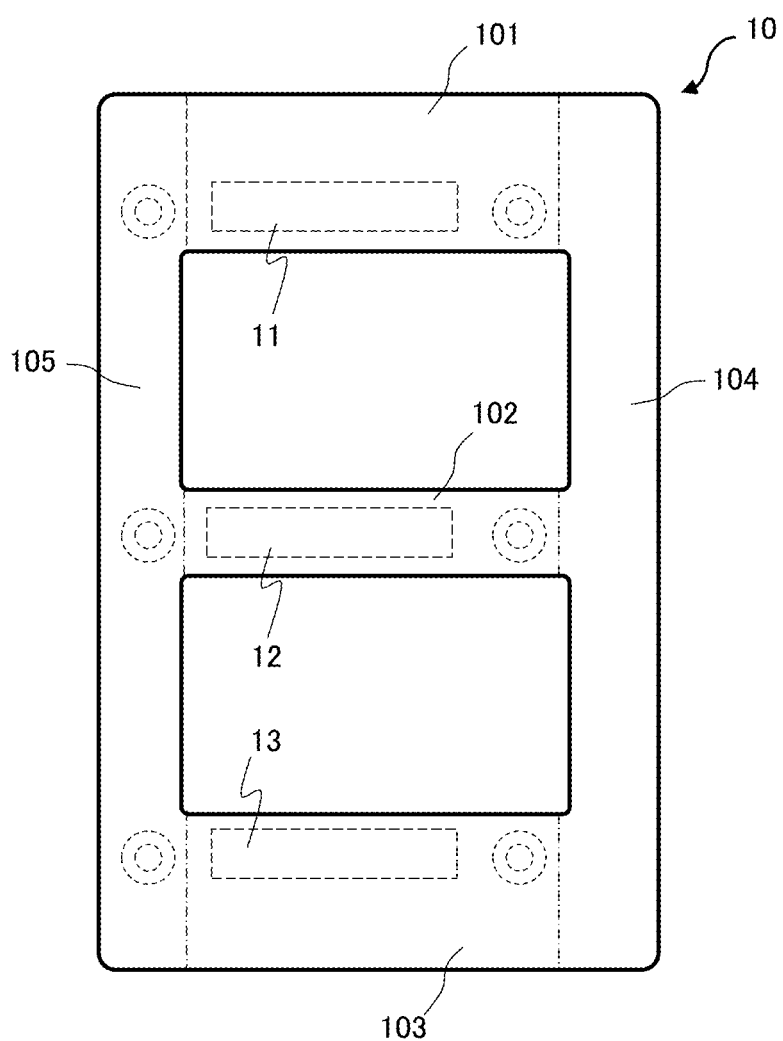
FIG. 3 is a diagram for describing a GND pattern.
Figure 4A:
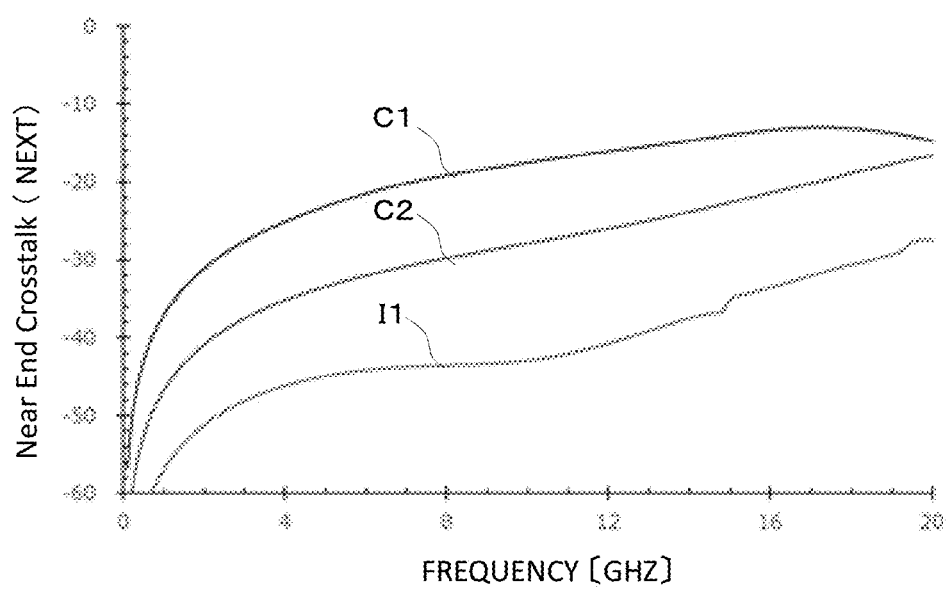
FIG. 4A is a comparative characteristic diagram for comparing characteristics of near end crosstalk (NEXT) in an embodiment 1 and a conventional example.
Figure 4B:
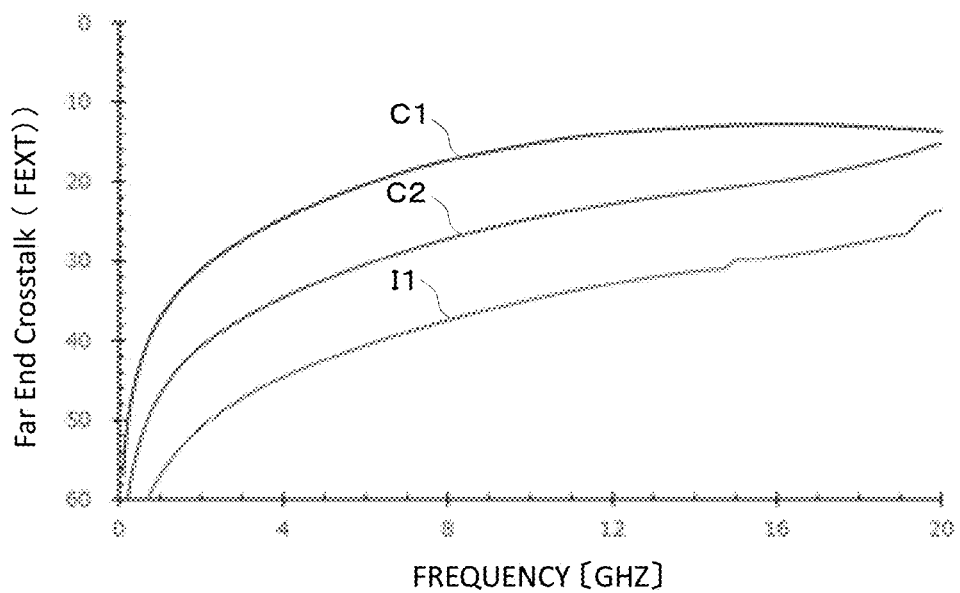
FIG. 4B is a comparative characteristic diagram comparing characteristics of far end crosstalk (FEXT) in an embodiment 1 and a conventional example.
Figure 20:
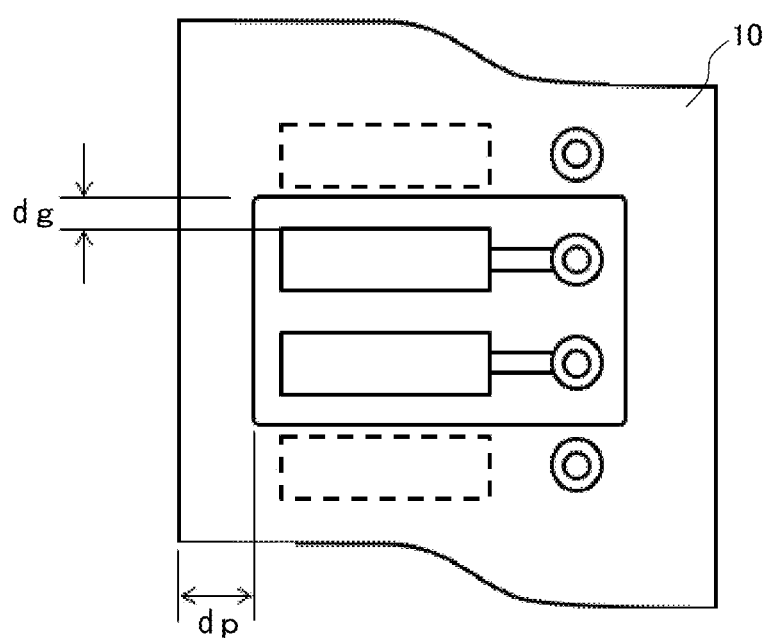
FIG. 20 is a diagram describing a width of a GND pattern and a gap between a GND pattern and a signal line according to an embodiment.

First, an embodiment 1 of the present invention will be described with reference to FIGS. 1 to 4B and FIG. 20. FIG. 1 is a diagram illustrating the embodiment 1 and is a main part plane view of a printed circuit board in which a connector is mounted. FIG. 2 is an enlarged perspective view illustrating a connection portion of a connector and a printed circuit board according to the embodiment 1. FIG. 3 is a diagram for describing a GND pattern (ground pattern). FIGS. 4A and 4B are comparative characteristic diagrams for comparing crosstalk characteristics in the embodiment 1 of the present invention and conventional examples (a conventional example 1 and a conventional example 2). FIG. 4A illustrates comparison characteristics of near end crosstalk (Near End CrossTalk (NEXT)), and FIG. 4B illustrates comparison characteristics of far end crosstalk (Far End CrossTalk (FEXT)). FIG. 20 is a diagram describing a width of the GND pattern and a gap between the GND pattern and a signal line according to the embodiment of the present invention.

FIGS. 1 and 2, a printed circuit board 100 includes a plurality of signal transmission paths 1 and 2, and is configured to be connected with a connector 50 including a plurality of pins 51 to 57 disposed at end portions of another printed circuit board 200 by soldering. In FIG. 1, the pins 51 to 57 of the connector 50 are indicated by an alternate long and short dash line.

The signal transmission path 1 according to the embodiment 1 includes a pair of signal lines (signal pads) 1a and 1b and constitutes a signal transmission path of the differential scheme. Similarly, the signal transmission path 2 includes a pair of signal lines (signal pads) 2a and 2b and constitutes the signal transmission path of the differential scheme. End portions (end portions on the right side in FIG. 1) located on the opposite side to a position at which the connector 50 of the signal lines 1a and 1b and signal lines 2a and 2b are respectively connected to wirings 41, 42, 43, and 44, and end portions of the respective signal lines are connected to a signal layer (not illustrated) arranged on the inner layer of the printed circuit board 100 via signal line through holes 1A, 1B, 2A, and 2B, respectively. Incidentally, in FIG. 1, "d" indicates a distance between the pin center and GND through holes 31 to 33 disposed on the connector side in a case in which the GND pins 55, 56, and 57 of the connector 50 are connected to a GND pattern 10. In the example of FIG. 1, positions of the GND through holes 31 to 33 are set to the left of the left ends of GND line areas (GND pad areas) 11 to 13. Also, in FIG. 2, an arrow N indicates a NEXT direction. An arrow F indicates an FEXT direction. An arrow L indicates a direction of an aggressor.

In the embodiment 1, as can be seen from FIG. 1, peripheral parts of the signal transmission paths 1 and 2 are surrounded by the GND pattern 10. In other words, the signal transmission paths 1 and 2 formed on the surface layer of the printed circuit board 100 are configured so that their four sides are surrounded by the GND pattern 10 having a rectangular space. In other words, the GND pattern 10 has a betta shape obtained by cutting out parts of the signal transmission paths 1 and 2 in a rectangular shape with a certain gap from the signal line. The GND pattern 10 includes the GND line areas 11 to 13 which are areas parallel to the signal line with a certain distance, and the GND pins 55 to 57 are connected in this area. Incidentally, the GND line areas 11 to 13 only show a part of the area of the GND pattern 10, and are not the area that has undergone special processing. Therefore, the GND line areas 11 to 13 are indicated by broken lines. Further, the respective signal lines 1a, 1b, 2a, and 2b are connected to the signal pin 51, 52, 53, and 54 of the connector 50.

Here, the configuration of the GND pattern 10 will be described in further detail with reference to FIG. 3. The GND pattern 10 according to the embodiment 1 includes GND areas 101 to 103 which include the GND line areas 11 to 13 and have a wider area than the GND line areas 11 to 13. In other words, it is a flat area in which a conductive film is uniformly formed. The GND areas 101 to 103 are disposed on both sides of the signal transmission paths 1 and 2. The GND pattern 10 in FIG. 3 includes a side GND area 104 which is a ground area on the signal line through hole (1A, 1B, 2A, and 2B) side and a side GND area 105 on the opposite side (connector connection side). In other words, the GND pattern 10 includes side ground areas 104 and 105 integrally connected to the end portions of the ground areas 101 to 103 disposed adjacent to the signal transmission paths.

Incidentally, the GND pattern 10 according to the embodiment 1 is configured to have both of the side GND area 104 and the side GND area 105. However, the GND pattern 10 in the present invention is not limited to such a shape. The GND pattern 10 in the present invention may be configured to have at least one of the side GND areas 104 and 105 in addition to the GND areas 101 to 103. The GND pattern 10 used in several embodiments to be described later has a configuration having any one of the side GND areas.

Now, the embodiment 1 will be described with reference back to FIG. 1 and FIG. 2. In FIG. 1, the GND through holes 21 to 23 are disposed on both sides of the signal line through holes (1A, 1B, 2A, and 2B) and connected (coupled) with the GND layer (not illustrated) of the printed circuit board inner layer. Further, the GND through holes 31 to 33 are disposed also on the side opposite to the signal line through hole side of the GND pattern 10 (the connector 50 connection side) to be connected with the GND layer of the inner layer. In other words, in the embodiment 1, the GND through holes are disposed on the top surface of the GND pattern 10 adjacent to both end portions of the signal line.

Incidentally, as illustrated in FIG. 20, a pattern width dp of the GND pattern 10 according to the embodiment 1 is 250 µm or more. This is because, in a case in which the pattern width is small, the impedance between the signal and the GND increases and a sufficient effect is unable to be obtained. Also, a gap width dg between the end of the inner side of the GND pattern 10 and the end of the signal line is 300 µm or more. This is because, in a case in which the gap width dg is small, the capacity of the signal line increases, resulting in deterioration in signal characteristics other than crosstalk noise. The numerical values of the pattern width dp and the gap width dg are similar in other embodiments to be described later.

With such a configuration, in the signal of the signal transmission path 1, the return current flows to the common ground of the GND pattern 10 of the surface layer, and also in the signal of signal transmission path 2, the return current flows to the common ground of the GND pattern 10 of the surface layer, and thus they are offset, whereby the return current of one signal transmission path is not superimposed on the signal of another signal transmission path. In other words, the crosstalk noise in each signal transmission path is reduced. Further, in this the embodiment, a common connection with the GND layer of the inner layer via the GND through holes 21 to 23 and the GND through holes 31 to 33 is implemented, and thus it is possible to reduce signal fluctuation caused by the detour of the return current path and improve the differential signal transmission characteristics. Accordingly, it is possible to reduce the crosstalk of the signal transmission path reliably even in the high speed transmission.

The crosstalk noise reduction according to the embodiment of the present invention is also clear from the characteristics diagrams illustrated in FIGS. 4A and 4B. FIGS. 4A and 4B are characteristic diagrams of crosstalk noise obtained by simulations. In FIGS. 4A and 4B, characteristics of C1 indicate characteristics according to the configuration of the conventional example 1, and characteristics of C2 indicate characteristics according to the configuration of the conventional example 2. I1 indicates characteristics in the configuration of the embodiment 1 of the present invention. In both the NEXT characteristics (FIG. 4A) and the FEXT characteristics (FIG. 4B), it can be seen that the characteristics I1 of the present invention is less in crosstalk than the characteristics (C1 and C2) of the conventional examples.

Figure 5:
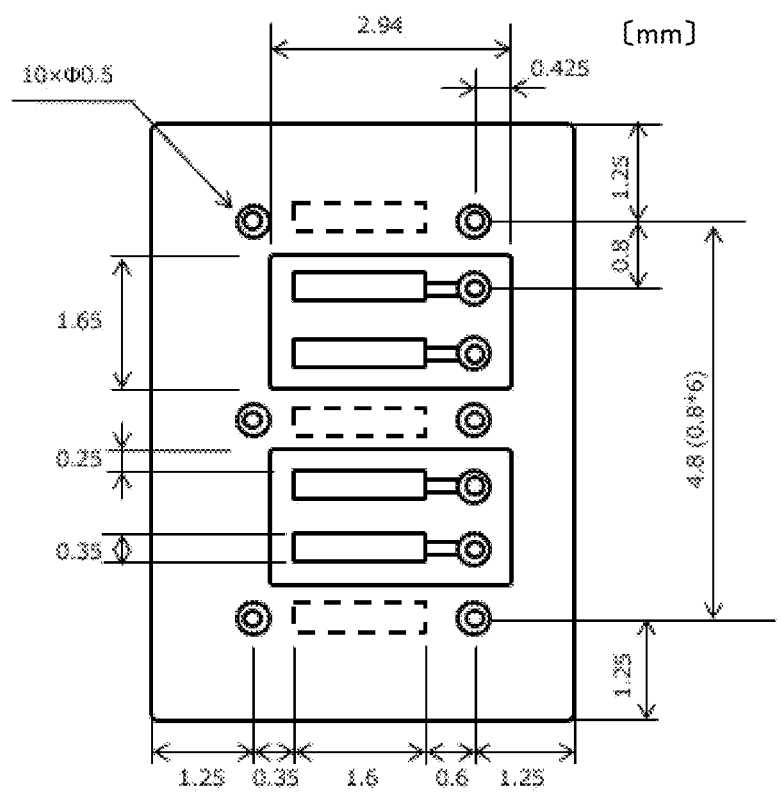
FIG. 5 is a diagram illustrating dimensions of respective components used for obtaining characteristics of an embodiment 1.

Incidentally, the characteristics illustrated in FIGS. 4A and 4B are obtained by simulations, and the characteristics by the simulations are obtained by setting the dimensions illustrated in FIG. 5. In other words, the length of the signal line is 1.6 mm, the width of the signal line is 0.35 mm, the distance between the GND pattern and the signal line is 0.25 mm, the diameters of the GND through hole and the signal line through hole are 0.5 mm, the distance between the outer side end of the GND pattern and the GND through hole is 1.25 mm, and the like. The other dimensions are as illustrated in FIG. 5. Further, the electric conductivity of the conductors constituting the signal line and the GND is 5.8e-7 (S/m), the dielectric constant of the dielectric material which is a material of the printed circuit board is 4.1, and the dielectric loss tangent is 0.015. Under these conditions, the characteristics I1 are obtained as the crosstalk characteristics according to the embodiment 1 of the present invention by the simulation. Further, in the conventional examples 1 and 2, the GND line (ground pad) is used instead of the GND pattern 10, but other characteristics such as the dimensions are similar to those in the case of FIG. 5, and the crosstalk characteristics are obtained by the simulation. Incidentally, the drawings illustrating the crosstalk noise characteristics for other embodiments to be described below also illustrate simulation results obtained under similar conditions.

As described above, according to the embodiment 1, it is possible to reduce the crosstalk noise with the simple configuration in which the GND pattern 10 is disposed to surround the signal transmission path (see FIG. 3), and both sides of the GND pattern 10 are connected to the GND layer of the lower layer via the GND through hole. Further, because it can be realized with the simple configuration, the printed circuit board can be easily manufactured, and the crosstalk of the signal transmission path can be reliably reduced reliably.

Embodiment 2

Figure 6:
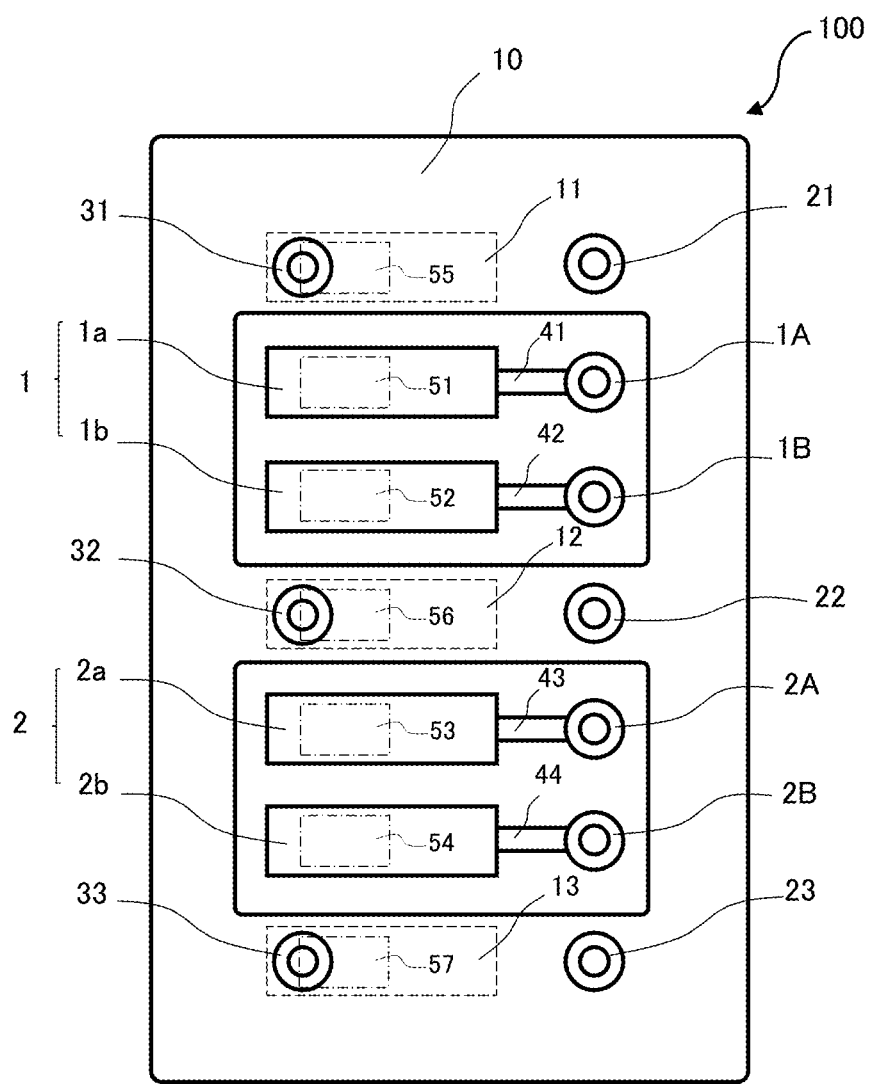
FIG. 6 is a main part plane view of a printed circuit board in which a connector is mounted according to an embodiment 2.
Figure 7A:
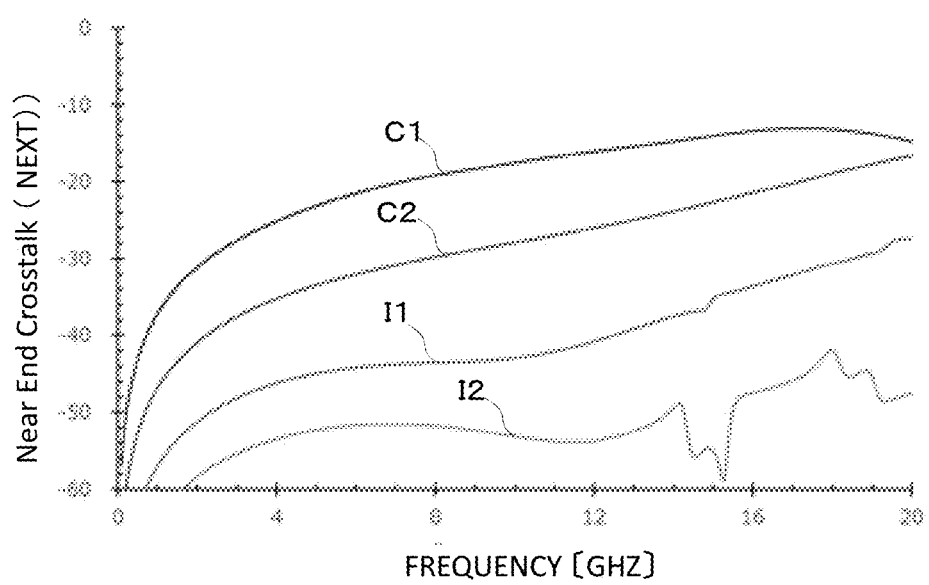
FIG. 7A is a comparative characteristic diagram for comparing characteristics of near end crosstalk (NEXT) in an embodiment 2 and a conventional example.
Figure 7B:
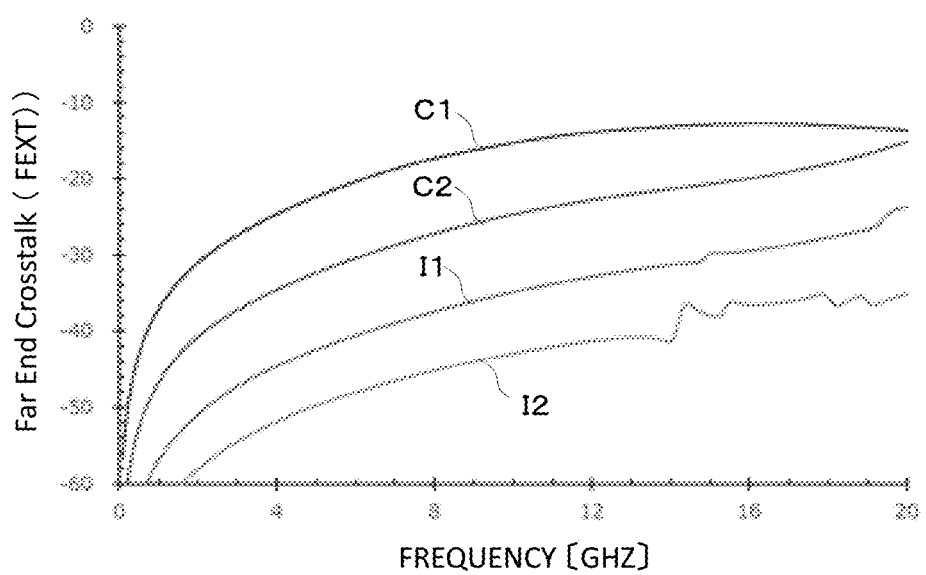
FIG. 7B is a comparative characteristic diagram for comparing characteristics of far end crosstalk (FEXT) in an embodiment 2 and a conventional example.

Next, an embodiment 2 of the present invention will be described with reference to FIG. 6 and FIGS. 7A and 7B. FIG. 6 is a diagram illustrating the embodiment 2 and is a main part plane view of a printed circuit board in which a connector is mounted. FIG. 7A is a comparative characteristic diagram for comparing near end crosstalk (NEXT) in the embodiment 2 and a conventional example. FIG. 7B is a comparative characteristic diagram for comparing far end crosstalk (FEXT) in the embodiment 2 and a conventional example.

As can be seen from FIG. 6, the configuration of FIG. 6 and the configuration of FIG. 1 (the embodiment 1) are almost similar to each other. In FIG. 1, the GND through holes 31 to 33 are installed at position in the side GND area 105 which is the area to the right of the GND line areas 11 to 13. On the other hand, FIG. 6 of the embodiment 2 differs in that the positions at which the GND through holes 31 to 33 are installed are the positions within the GND line areas 11 to 13 included in the GND area. Even in the configuration illustrated in FIG. 6, it is possible to enhance the noise reduction effect for the high frequency component of the return current and to reliably reduce the crosstalk noise.

The crosstalk noise reduction according to the embodiment of the present invention is also clear from the characteristics diagrams illustrated in FIGS. 7A and 7B. In FIGS. 7A and 7B, characteristics of C1 indicate characteristics according to the configuration of the conventional example 1, and characteristics of C2 indicate characteristics according to the configuration of the conventional example 2. I2 indicates characteristics in the configuration of the embodiment 2. In FIGS. 7A and 7B, the characteristics I1 of the embodiment 1 are also illustrated in order to compare the degree of crosstalk noise reduction in the embodiment 2 and the embodiment 1. In both the NEXT characteristics (FIG. 7A) and the FEXT characteristics (FIG. 7B), it can be seen that the characteristics I2 of the embodiment 2 is less in crosstalk than the characteristics (C1 and C2) of the conventional examples. Further, it can be seen that the characteristics I2 of the embodiment 2 are even more excellent in the crosstalk noise reduction effect than the characteristics I1 of the embodiment 1. In the example of the embodiment 2, the GND through holes 31 to 33 are disposed at the pin connection positions, and thus pad on via is applied to connect the pin of the connector 50 with the GND through hole. Therefore, the number of processes is increased compared to the example of the embodiment 1. Incidentally, the conditions (dimensions and materials) for obtaining the characteristics in FIGS. 7A and 7B are similar to those described in the embodiment 1 (see FIG. 5).

As described above, according to the embodiment 2, it is possible to reduce the crosstalk noise with the simple configuration in which the GND pattern 10 is disposed to surround the signal transmission path (see FIG. 3), and both sides of the GND pattern 10 are connected to the GND layer of the lower layer via the GND through hole. Further, in the embodiment 2, the crosstalk noise can be further reduced as compared with the example of the embodiment 1.

Embodiment 3

Figure 8:
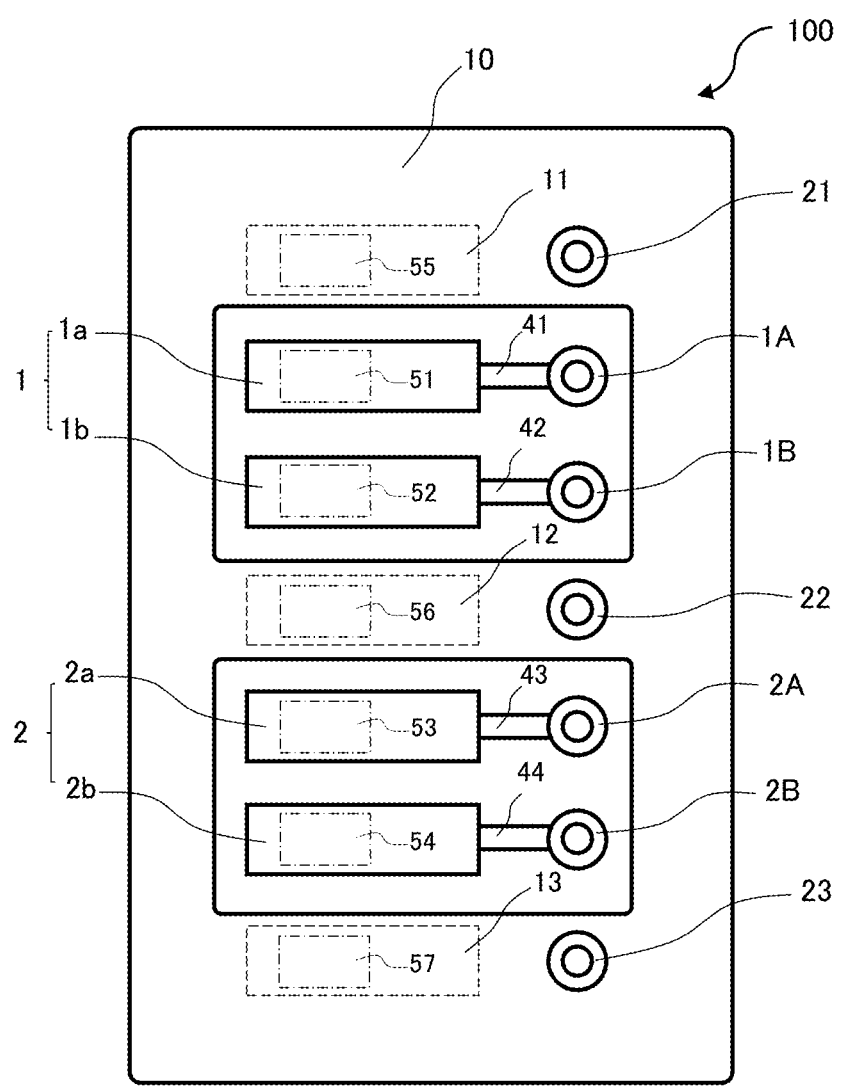
FIG. 8 is a main part plane view of a printed circuit board in which a connector is mounted according to an embodiment 3.
Figure 9A:
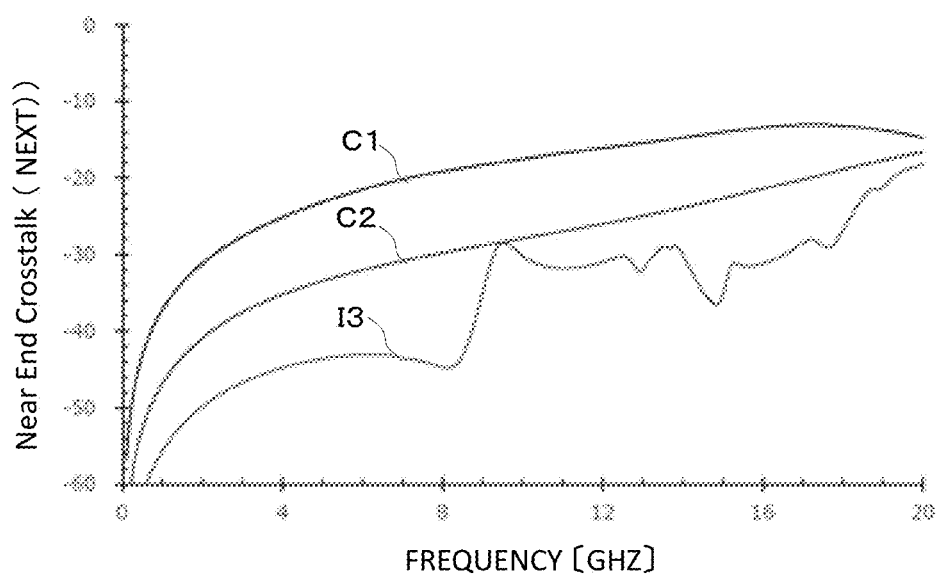
FIG. 9A is a comparative characteristic diagram for comparing characteristics of near end crosstalk (NEXT) in an embodiment 3 and a conventional example.
Figure 9B:
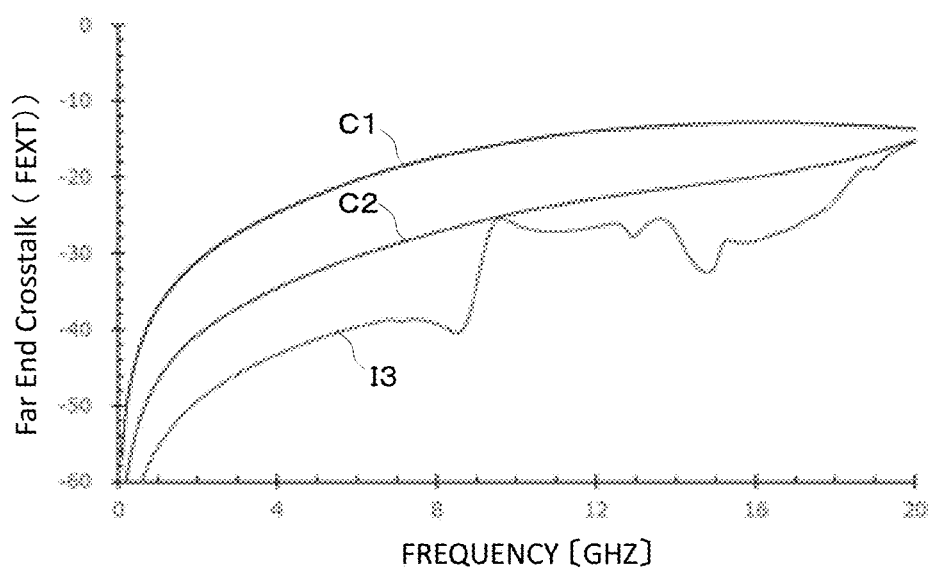
FIG. 9B is a comparative characteristic diagram for comparing characteristics of far end crosstalk (FEXT) in an embodiment 3 and a conventional example.

Next, an embodiment 3 of the present invention will be described with reference to FIG. 8 and FIGS. 9A and 9B. FIG. 8 is a diagram illustrating the embodiment 3 and is a main part plane view of a printed circuit board in which a connector is mounted. FIG. 9A is a characteristics diagram for comparing near end crosstalk (NEXT) in the embodiment 3 and a conventional example. FIG. 9B is a characteristics diagram for comparing far end crosstalk (FEXT) in the embodiment 3 and a conventional example.

In FIG. 8, a difference between the configuration of FIG. 8 and the configuration of FIG. 1 (the embodiment 1) lies in whether or not some of the GND through holes are installed, and the other configurations are similar. In other words, in FIG. 1, the GND through holes 31 to 33 are installed at positions outside the GND line areas 11 to 13. On the other hand, FIG. 8 of the embodiment 3 differs in that the GND through holes 31 to 33 are not installed.

The operational effects of the embodiment illustrated in FIG. 8 are basically similar to those of the embodiment 1 described above, and description thereof is omitted. Also in the configuration illustrated in FIG. 8, the noise reduction effect for the high frequency component of the return current can be increased and crosstalk noise can be reliably reduced.

The crosstalk noise reduction characteristics according to the embodiment 3 (FIG. 8) are illustrated in FIG. 9A and FIG. 9B. FIGS. 9A and 9B, characteristics of C1 indicate characteristics according to the configuration of the conventional example 1, and characteristics of C2 indicate characteristics according to the configuration of the conventional example 2. I3 indicates characteristics of the embodiment 3. Incidentally, the conditions (dimensions and materials) for obtaining the characteristics in FIGS. 9A and 9B are similar to those described in the embodiment 1. In both the NEXT characteristics (FIG. 9A) and the FEXT characteristics (FIG. 9B), it can be seen that the characteristics I3 of the embodiment 2 is less in crosstalk than the characteristics (C1 and C2) of the conventional examples. In the embodiment 3, the crosstalk noise reduction effect is inferior to that according to the embodiment 1, but since the GND through holes 31 to 33 are not provided, the structure is simpler.

As described above, according to the embodiment 3 of the present invention, there is an effect of reducing the crosstalk noise of the signal transmission path. Further, it is easy to manufacture, and costs can be reduced.

Embodiment 4

Figure 10:
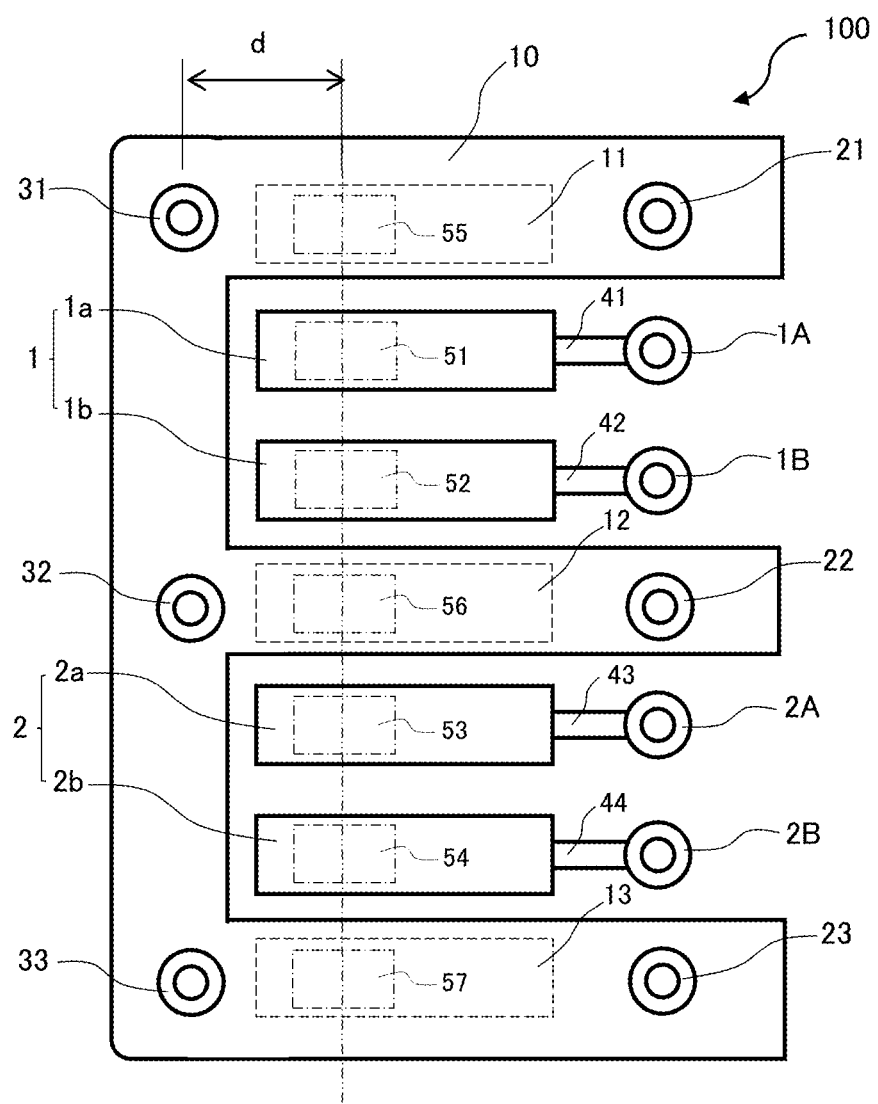
FIG. 10 is a main part plane view of a printed circuit board in which a connector is mounted according to an embodiment 4.
Figure 11A:
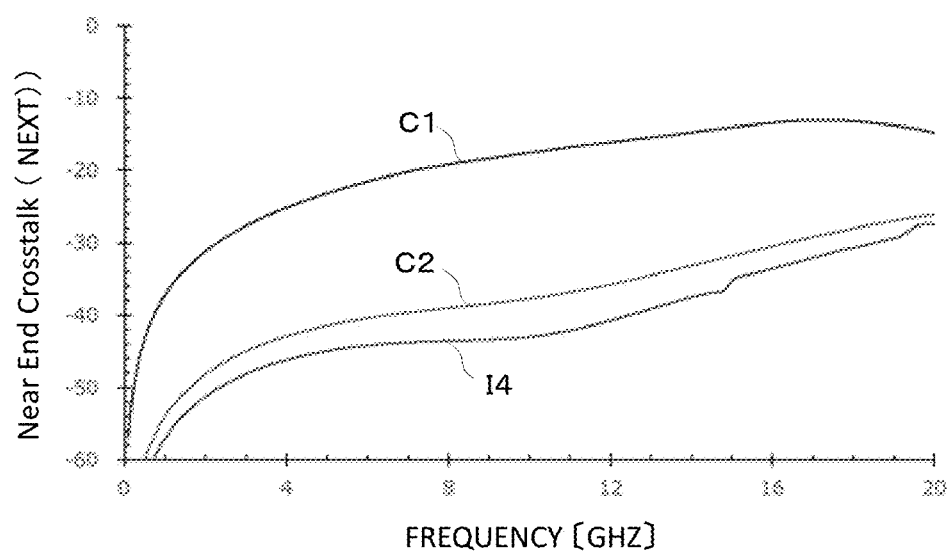
FIG. 11A is a comparative characteristic diagram for comparing characteristics of near end crosstalk (NEXT) in an embodiment 4 and a conventional example.
Figure 11B:
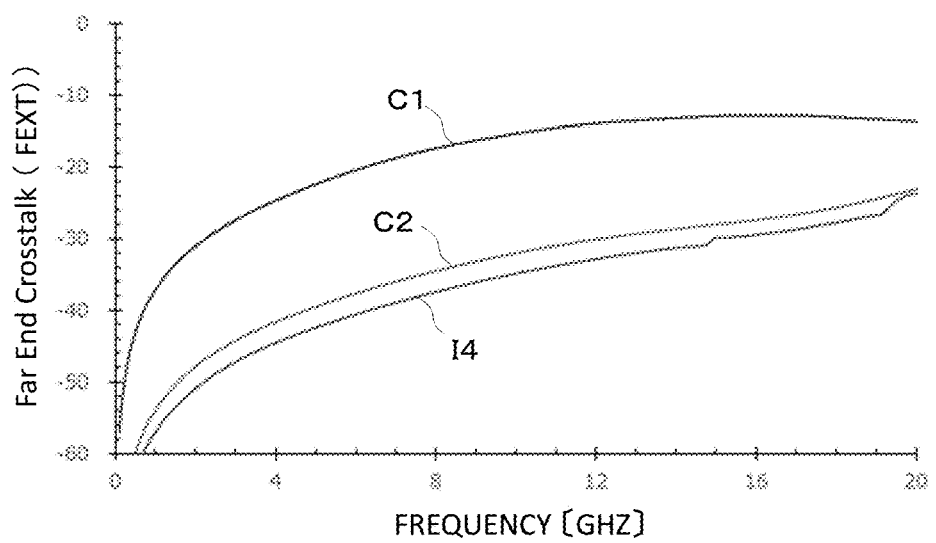
FIG. 11B is a comparative characteristic diagram for comparing characteristics of far end crosstalk (FEXT) in an embodiment 4 and a conventional example.

Next, an embodiment 4 of the present invention will be described with reference to FIG. 10 and FIGS. 11A, and 11B. FIG. 10 is a diagram illustrating the embodiment 4 and is a main part plane view of a printed circuit board in which a connector is mounted. FIG. 11A is a characteristics diagram for comparing near end crosstalk (NEXT) in the embodiment 4 and a conventional example. FIG. 11B is a characteristics diagram for comparing far end crosstalk (FEXT) in the embodiment 4 and a conventional example.

In FIG. 10, a configuration is similar to that in FIG. 1 (the embodiment 1), except that the shape of the GND pattern 10 is different. In other words, the GND pattern 10 in FIG. 1 had a shape in which the entire periphery of the signal transmission paths 1 and 2 are surrounded by a conductive film. On the other hand, in the GND pattern 10 in FIG. 10, the side GND area 105 on the connector connection side of the signal transmission paths 1 and 2 is disposed, but the side GND area 104 on the signal line through hole side of the signal transmission paths 1 and 2 is not disposed (see FIG. 3). In other words, the GND pattern 10 in FIG. 10 has a shape of surrounding three sides around the signal transmission paths 1 and 2.

The operational effects of the embodiment illustrated in FIG. 10 are almost similar to those of the embodiment 1 described above, and the description is omitted. Also in the configuration of FIG. 10, it is possible to enhance the noise reduction effect for the high frequency component of the return current and to reliably reduce the crosstalk noise.

The crosstalk noise reduction characteristics according to the embodiment 4 (FIG. 10) are illustrated in FIGS. 11A and 11B. In FIGS. 11A and 11B, characteristics of C1 indicate characteristics according to the configuration of the conventional example 1, and characteristics of C2 indicate characteristics according to the configuration of the conventional example 2. I4 indicates characteristics of the embodiment 4. In both the NEXT characteristics (FIG. 11A) and the FEXT characteristics (FIG. 11B), it can be seen that the characteristics I4 of the embodiment 4 is less in crosstalk than the characteristics (C1 and C2) of the conventional examples. Incidentally, the conditions (dimensions and materials) for obtaining the characteristics in FIGS. 11A and 11B are similar to those described in the embodiment 1.

As described above, according to the embodiment 4, there is an effect of reducing the crosstalk noise of the signal transmission path. Further, it is easy to manufacture, and costs can be reduced.

Embodiment 5

Figure 12:
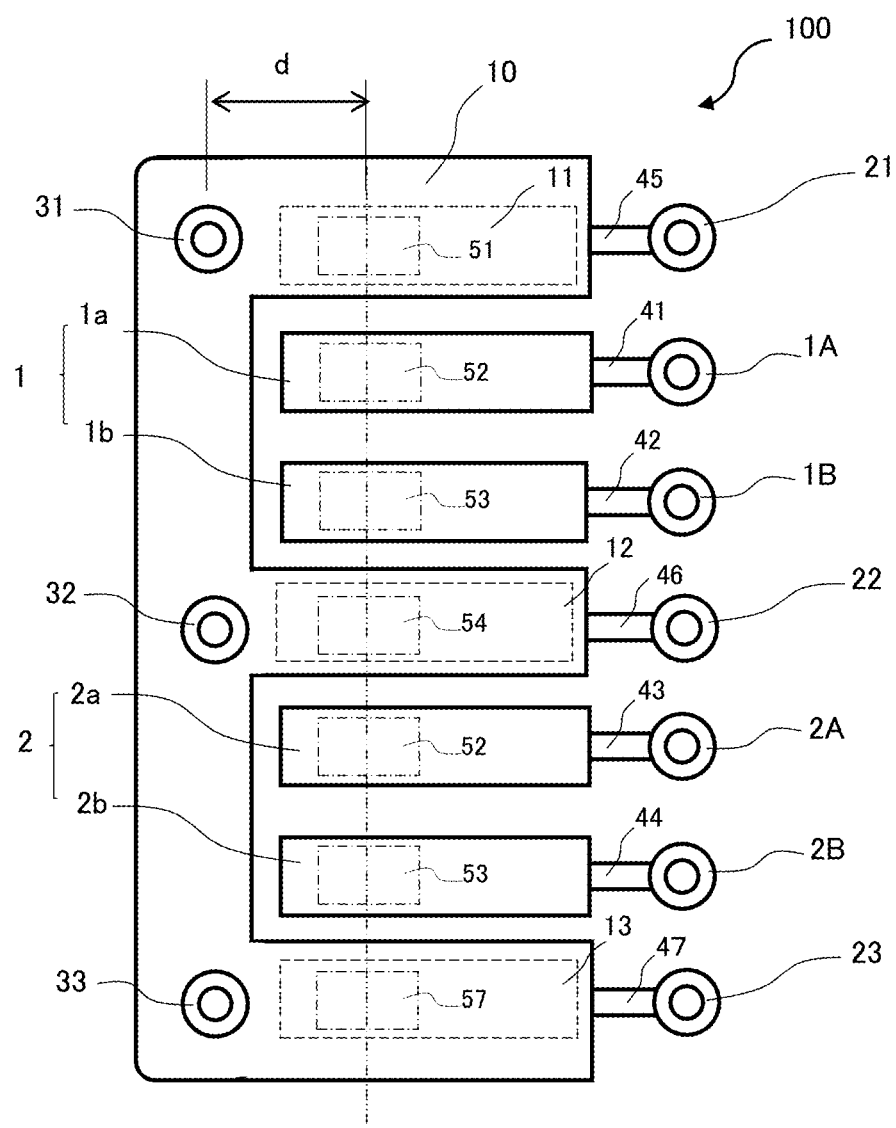
FIG. 12 is a main part plane view of a printed circuit board in which a connector is mounted according to an embodiment 5.

Next, an embodiment 5 of the present invention will be described with reference to FIG. 12. FIG. 12 is a diagram illustrating the embodiment 5 and is a main part plane view of a printed circuit board in which a connector is mounted.

A difference between the configuration in FIG. 12 and the configuration in FIG. 10 (the embodiment 4) lies in a connection method of the GND through holes 21 to 23 and the GND pattern 10. In other words, in FIG. 10, the GND through holes 21 to 23 that connect the GND pattern 10 with the GND layer of the lower layer are disposed in the GND pattern 10, and connects the GND pattern 10 with the GND layer of the lower layer directly. On the other hand, in FIG. 12 (the embodiment 5), wirings 45 to 47 are disposed between the end portions of the GND pattern 10 and the GND through holes 21 to 23, respectively, to connect them indirectly.

The operational effects of the embodiment 5 illustrated in FIG. 12 are almost similar to those of the embodiment 1 described above, and description thereof is omitted. Also in the configuration of FIG. 12, the noise reduction effect for the high frequency component of the return current can be enhanced and crosstalk noise can be reliably reduced. Incidentally, although the description of comparing the characteristics according to the embodiment 5 with the characteristics of the related art is omitted, the characteristics according to the embodiment 5 are similar to those according to the embodiment 4 (see FIGS. 11A and 11B).

Embodiment 6

Figure 13:
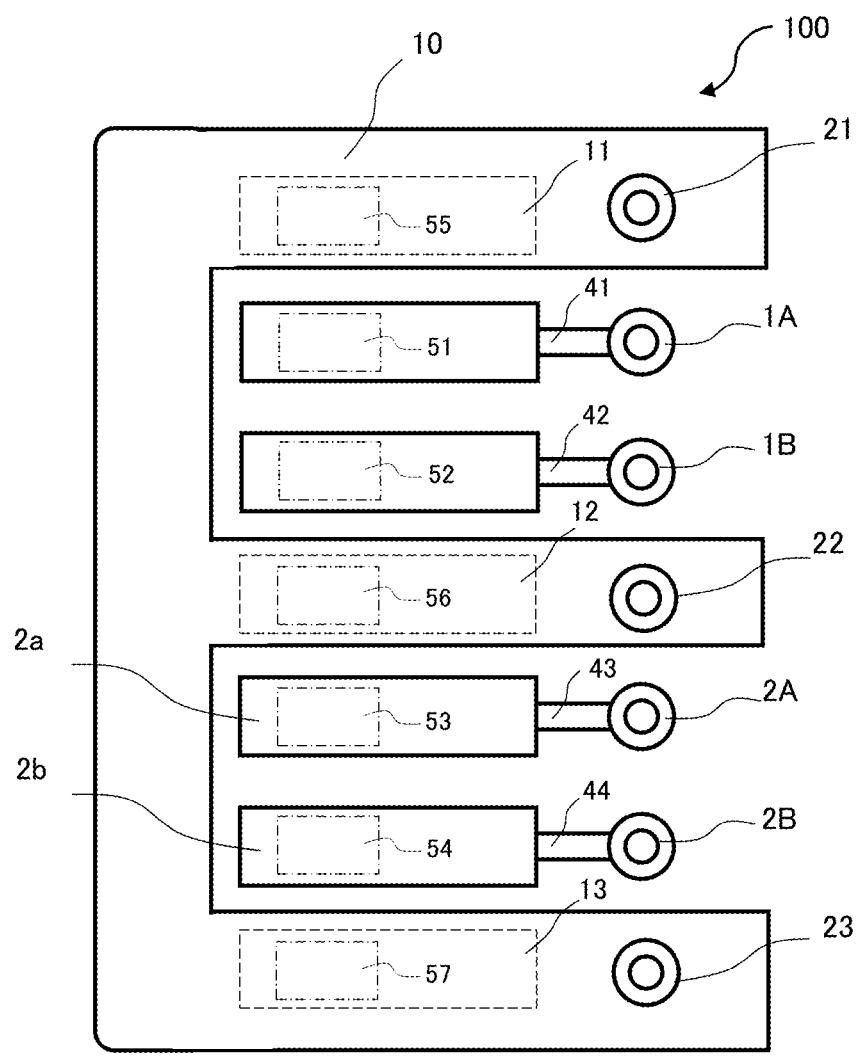
FIG. 13 is a main part plane view of the printed circuit board in which a connector is mounted according to an embodiment 6.
Figure 14A:
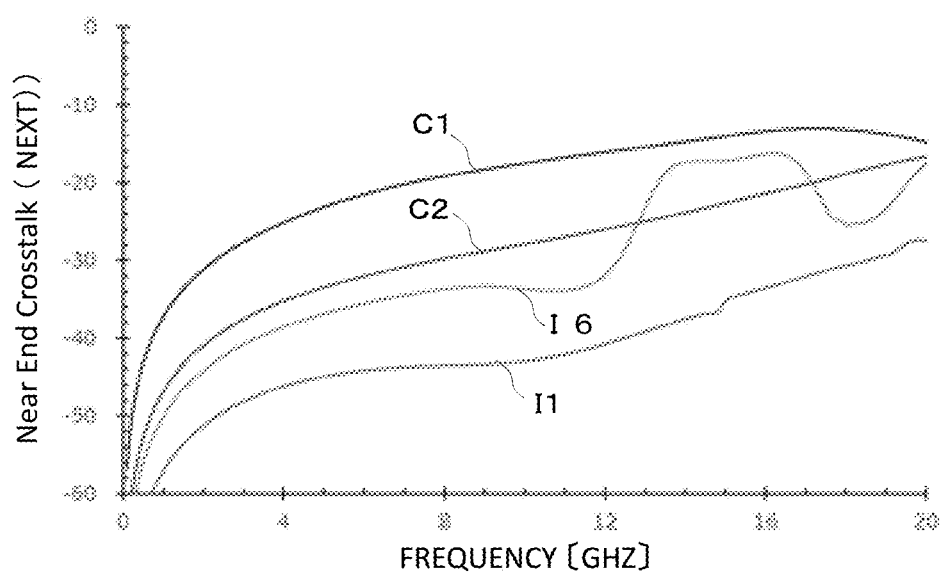
FIG. 14A is a comparative characteristic diagram for comparing characteristics of near end crosstalk (NEXT) in an embodiment 6 and a conventional example.
Figure 14B:
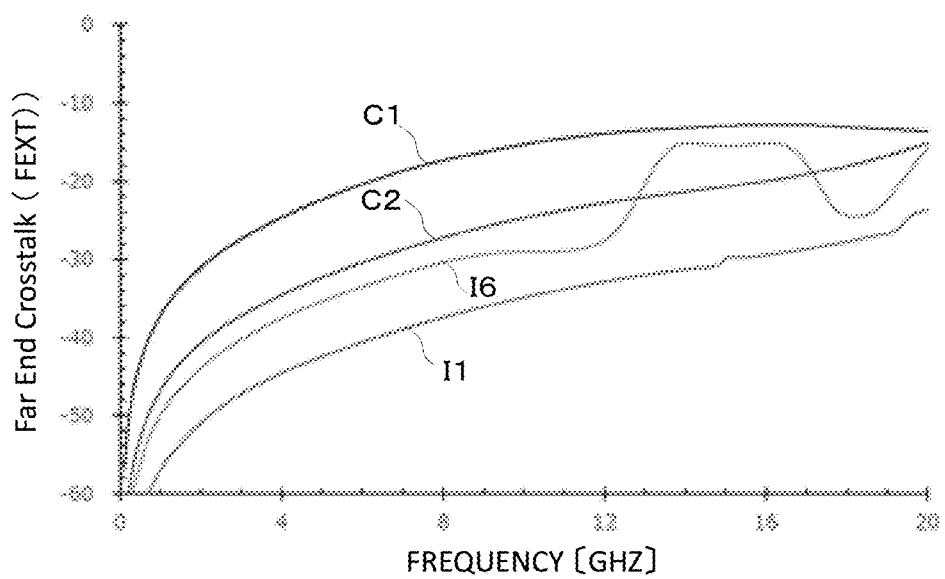
FIG. 14B is a comparative characteristic diagram for comparing characteristics of far end crosstalk (FEXT) in an embodiment 6 and a conventional example.

Next, an embodiment 6 of the present invention will be described with reference to FIG. 13 and FIGS. 14A, and 14B. FIG. 13 is a diagram illustrating the embodiment 6 and is a main part plane view of a printed circuit board in which a connector is mounted. FIG. 14A is a characteristics diagram for comparing near end crosstalk (NEXT) in the embodiment 6, the embodiment 1, and the conventional examples 1 and 2. FIG. 14B is a characteristics diagram for comparing far end crosstalk (FEXT) in the embodiment 6, the embodiment 1, and the conventional examples 1 and 2.

The configuration in FIG. 13 is almost similar to that in FIG. 10 (the embodiment 4). In other words, in FIG. 10, the installation positions of the GND through holes 31 to 33 are located outside the GND line areas 11 to 13. On the other hand, in FIG. 13 of the embodiment 6, the GND through holes 31 to 33 are not installed. The other configurations are similar.

The operational effects of the embodiment 6 illustrated in FIG. 13 are almost similar to those of the embodiment 4 described above, and a description thereof is omitted. As illustrated in FIG. 14A and FIG. 14B, according to the embodiment 6, it is possible to reduce the crosstalk noise to be smaller than in the characteristics C1 and C2 of the conventional examples in the range of a certain frequency range (12 GHZ or less). However, the crosstalk noise reduction is smaller than in the characteristics I1 of the embodiment 1.

As described above, even in the configuration illustrated in FIG. 13, it is possible to increase the noise reduction effect for the high frequency component of the return current in a certain frequency range and reduce the crosstalk noise reliably.

Embodiment 7

Figure 15:
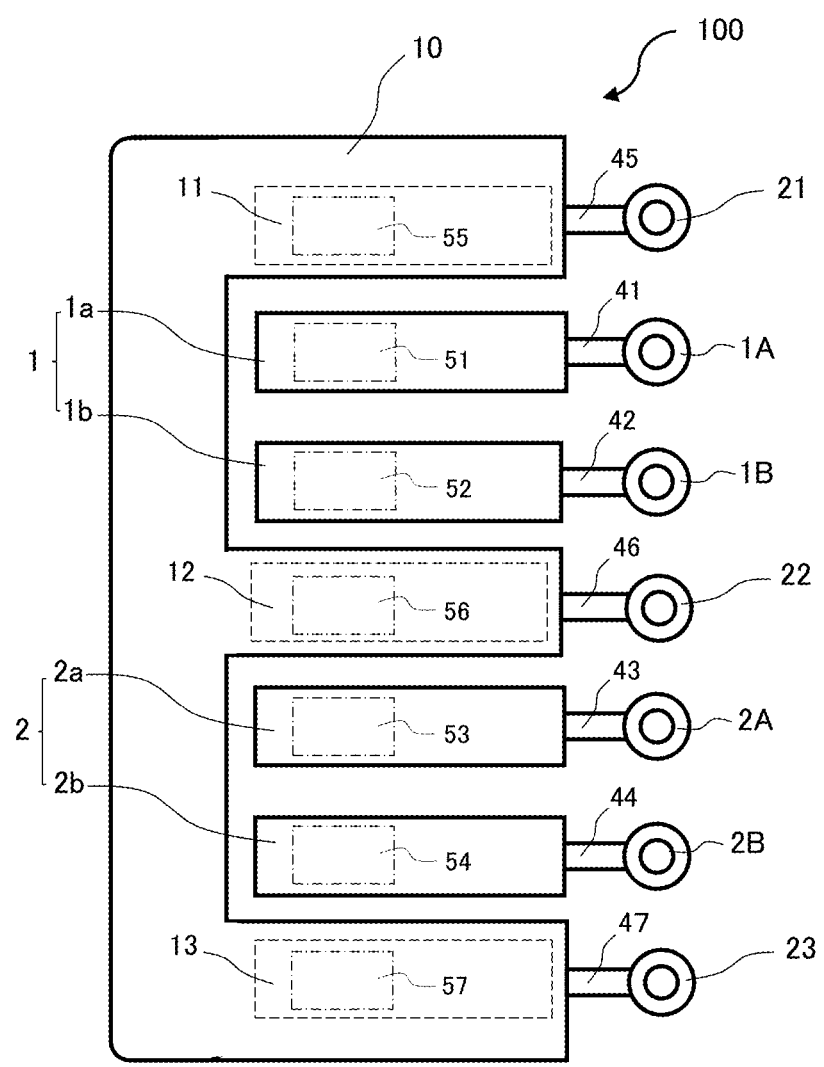
FIG. 15 is a main part plane view of a printed circuit board in which a connector is mounted according to an embodiment 7.

Next, an embodiment 7 of the present invention will be described with reference to FIG. 15. FIG. 15 is a diagram illustrating the embodiment 7 and is a main part plane view of a printed circuit board in which a connector is mounted.

The configuration in FIG. 15 is almost similar to that in FIG. 13 (the embodiment 6). A difference lies in that the connection method of the GND through holes 21 to 23 and the GND pattern 10 is different. In other words, in FIG. 13, the GND through holes 21 to 23 that connect the GND pattern 10 and the GND layer of the lower layer are disposed in the GND pattern 10, and connects the GND pattern 10 with the GND layer of the lower layer directly. On the other hand, in FIG. 15 (the embodiment 7), wirings 45 to 47 are disposed between the end portions of the GND pattern 10 and the GND through holes 21 to 23, respectively, to connect them indirectly.

The operational effects of the embodiment 7 illustrated in FIG. 15 are almost similar to those of the embodiment 1 described above, and description thereof is omitted. Also in the configuration of FIG. 15, in a certain frequency range, the noise reduction effect for the high frequency component of the return current can be enhanced and crosstalk noise can be reliably reduced. Incidentally, although the description of comparing the characteristics according to the embodiment 7 with the characteristics of the related art is omitted, the characteristics according to the embodiment 7 are similar to those according to the embodiment 6 (see FIGS. 14A and 14B).

Embodiment 8

Figure 16:
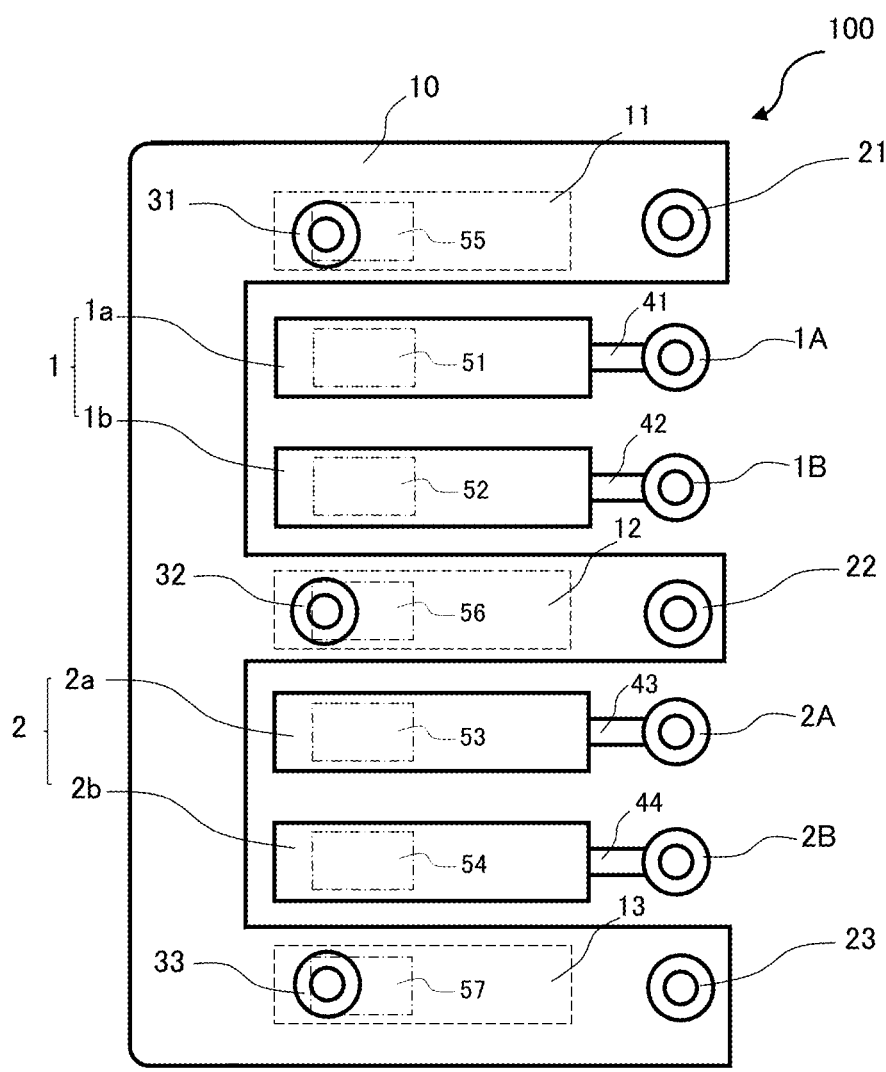
FIG. 16 is a main part plane view of a printed circuit board in which a connector is mounted according to an embodiment 8.

Next, an embodiment 8 of the present invention will be described with reference to FIG. 16. FIG. 16 is a diagram illustrating the embodiment 8 and is a main part plane view of a printed circuit board in which a connector is mounted.

The configuration of FIG. 16 is almost similar to that of FIG. 10 (the embodiment 4). A difference lies in that in FIG. 10, the GND through holes 31 to 33 are installed on the side GND area 105 which is the area to the right of the GND line areas 11 to 13. On the other hand, FIG. 16 of the embodiment differs in that the positions at which the GND through holes 31 to 33 are installed are the positions within the GND line areas 11 to 13 included in the GND area.

The operational effects of the embodiment 8 illustrated in FIG. 16 are almost similar to those of the embodiment 4 described above, and description thereof is omitted. Also in the configuration of FIG. 16, the noise reduction effect for the high frequency component of the return current can be increased and crosstalk noise can be reliably reduced.

Embodiment 9

Figure 17:
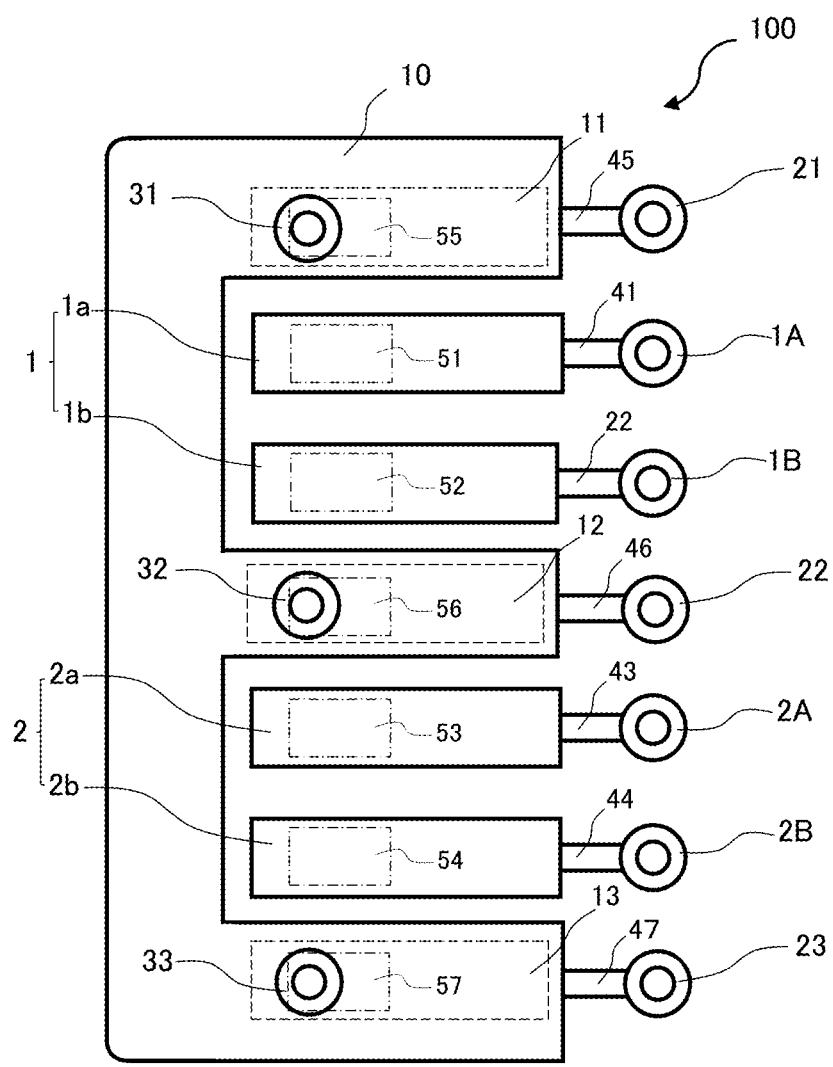
FIG. 17 is a main part plane view of a printed circuit board in which a connector is mounted according to an embodiment 9.

Next, an embodiment 9 of the present invention will be described with reference to FIG. 17. FIG. 17 is a diagram illustrating the embodiment 9 and is a main part plane view of a printed circuit board in which a connector is mounted.

A difference between the configuration in FIG. 17 and the configuration in FIG. 16 (the embodiment 8) lies in that the connection method of the GND through holes 21 to 23 and the GND pattern 10 is different. In other words, in FIG. 16, the GND through holes 21 to 23 that connect the GND pattern 10 and the GND layer of the lower layer are disposed in the GND pattern, and connects the GND pattern 10 with the GND layer of the lower layer directly. On the other hand, in FIG. 17 (the embodiment 9), wirings 45 to 47 are disposed between the end portions of the GND pattern 10 and the GND through holes 21 to 23, respectively, to connect them indirectly.

Also in the embodiment 9 illustrated in FIG. 17, the noise reduction effect for the high frequency component of the return current can be increased and crosstalk noise can be reliably reduced.

Embodiment 10

Figure 18:
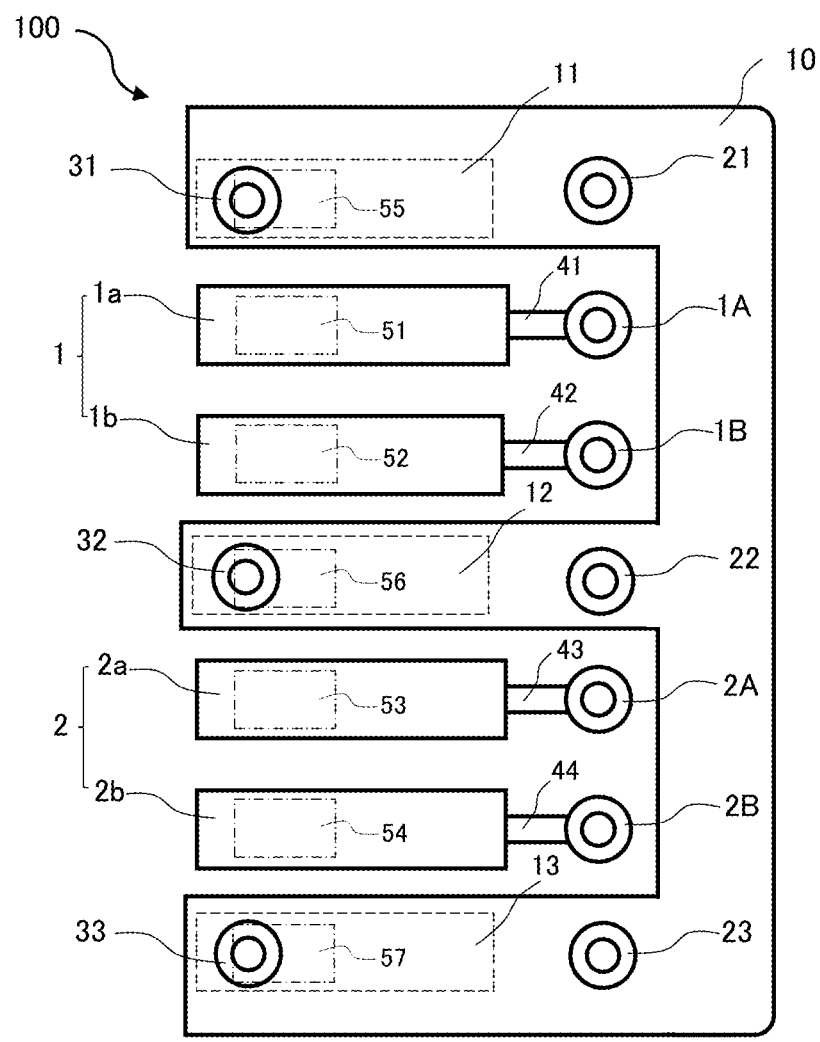
FIG. 18 is a main part plane view of a printed circuit board in which a connector is mounted according to an embodiment 10.

Next, an embodiment 10 of the present invention will be described with reference to FIG. 18. FIG. 18 is a diagram illustrating the embodiment 10 and is a main part plane view of a printed circuit board in which a connector is mounted.

In FIG. 18, a configuration is similar to that of FIG. 6 (the embodiment 2), except that the shape of the GND pattern 10 is different. In other words, in the example of FIG. 6, the GND pattern 10 of the surface layer has a shape of surrounding the entire periphery of the signal transmission path. On the other hand, in the GND pattern 10 in FIG. 18, the side GND area 104 on the signal line through hole side of the signal transmission paths 1 and 2 is disposed, but the side GND area 105 on the connector connection side of the signal transmission paths 1 and 2 (see FIG. 3) is not disposed.

The operational effects of the embodiment 10 illustrated in FIG. 18 are basically similar to those of the embodiment 2 described above. Also in the configuration of FIG. 18, the noise reduction effect for the high frequency component of the return current can be increased and crosstalk noise can be reliably reduced.

Embodiment 11

Figure 19:
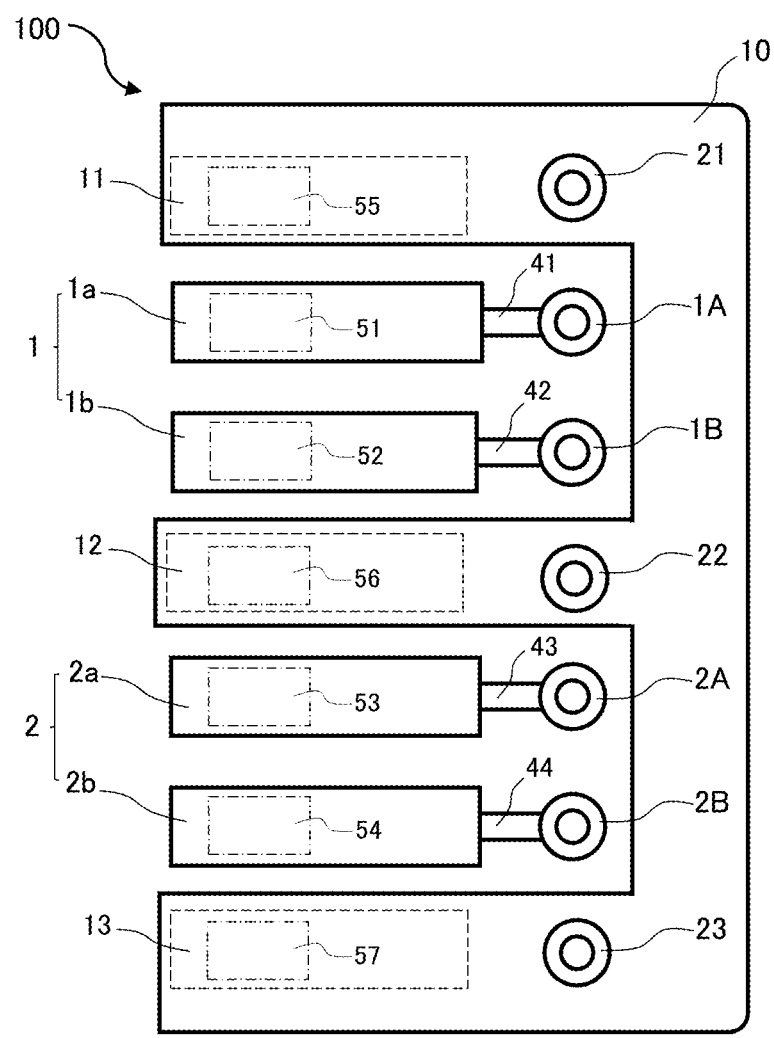
FIG. 19 is a main part plane view of a printed circuit board in which a connector is mounted according to an embodiment 11.

Next, an embodiment 11 of the present invention will be described with reference to FIG. 19. FIG. 19 is a diagram illustrating the embodiment 11 and is a main part plane view of a printed circuit board in which a connector is mounted.

There is little difference between the configuration in FIG. 19 and the configuration in FIG. 18 (the embodiment 10) except for the presence or absence of some GND through holes. In other words, in FIG. 18, the GND through holes 31 to 33 on the connector side are disposed, whereas in FIG. 19, the GND through holes 31 to 33 are not disposed. Also in the embodiment illustrated in FIG. 19, the noise reduction effect for the high frequency component of the return current can be increased and crosstalk noise can be reliably reduced.

Other Embodiments

The present invention is not limited to the embodiment of the present invention described above, and includes modified examples in which the configuration is modified within the scope not departing from the technical spirit or the gist of the present invention. Further, the above embodiments have been described in detail to facilitate understanding of the present invention, and the present invention is not limited to the configuration including all the described components. In addition, addition, deletion, or replacement of other components on some of the components of the embodiment can be made.

What is claimed is:

1. A signal transmission circuit, comprising:
a printed circuit board including a surface layer including a plurality of signal transmission paths that transmit a signal, each having a pair of signal lines extending in a first direction in plan view, and a pair of signal line through holes that respectively connect the pairs of signal lines of the signal transmission paths with a signal layer disposed in an inner layer of the printed circuit board, the printed circuit board further including a first ground through hole having a center aligned with respective centers of the pairs of signal line through holes in a second direction that is orthogonal to the first direction and is connected with a ground layer of the inner layer of the printed circuit board that forms a return current transmission path for the signal transmission paths, wherein a ground pattern having a rectangular shape includes a first ground area and a second ground area respectively disposed on both sides of a first signal transmission path, of the plurality of the signal transmission paths, in the second direction and a first side ground area is connected with at least respective one end sides of the first ground area and the second ground area, wherein the signal transmission paths and the respective pairs of signal lines are disposed in a cutout of the ground pattern and are in the same layer as the ground pattern, and are surrounded on all sides by the ground pattern, wherein the first ground through hole is disposed to connect the ground pattern with the ground layer, and wherein the first side ground area extends to a side of the rectangular ground pattern in the first direction and extends to the respective one end sides of the first ground area and the second ground area in the first direction.

2. The signal transmission circuit according to claim 1, wherein the first side ground area is disposed on a side of the ground pattern that is opposite to the pair of signal line through holes.

3. The signal transmission circuit according to claim 2, wherein the first ground area or the second ground area includes the first ground through hole.

4. The signal transmission circuit according to claim 1, wherein the pair of signal line through holes are on a first side with respect to a center of a side of the rectangular ground pattern that extends in the first direction, wherein the first side ground area is disposed on the first side.

5. The signal transmission circuit according to claim 4, further comprising a second ground through hole is disposed on a second side with respect to the center of the side of the rectangular ground pattern that extends in the first direction, wherein the ground pattern includes a second ground area disposed on the second side that includes the second ground hole.

6. The signal transmission circuit according to claim 1, further comprising: a second ground through hole disposed at a position of the first side ground area.

7. A printed circuit board, comprising:

a surface layer including a plurality of signal transmission paths that transmit a signal, each having a pair of signal lines extending in a first direction in plan view, and a pair of signal line through holes that respectively connect respective ends of the pairs of signal lines of the signal transmission paths with a signal layer of an inner layer, the printed circuit board further including a first ground through hole having a center aligned with respective centers of the pairs of signal line through holes in a second direction that is orthogonal to the first direction and is connected with a ground layer that forms a return current circuit for the signal transmission paths, wherein a ground pattern having a rectangular shape includes a first ground area and a second ground area respectively disposed on both sides of a first signal transmission path, of the plurality of the signal transmission paths, in the second direction and a first side ground area is connected with at least respective one end sides of the first ground area and the second ground area, wherein the signal transmission paths and the respective pairs of signal lines are disposed in a cutout of the ground pattern and are in the same layer as the ground pattern, and are surrounded on all sides by the ground pattern, wherein the first ground through hole is disposed to connect the ground pattern with the ground layer, and wherein the first side ground area extends to a side of the rectangular ground pattern in the first direction and extends to the respective one end sides of the first ground area and the second ground area in the first direction.

8. The printed circuit board according to claim 7, further comprising a second ground through hole disposed at a position of the first side ground area.

9. A signal transmission circuit, comprising:

a printed circuit board including a surface layer including a plurality of signal transmission paths, including a first signal transmission path and a second signal transmission path that transmit a signal, each of the plurality of signal transmission paths has a pair of signal lines extending in a first direction in plan view, a plurality of signal line through holes that respectively connect the signal transmission paths with a signal layer disposed in an inner layer of the printed circuit board, the printed circuit board including a first ground through hole having a center aligned with respective centers of the pair of signal line through holes in a second direction that is orthogonal to the first direction and is connected with a ground layer of the inner layer of the printed circuit board that forms a return current transmission path for the signal transmission paths, wherein a ground pattern having a rectangular shape includes a plurality of ground areas including a first ground area, a second ground area and a third ground area, the first ground area and the second ground area respectively disposed on both sides of the first signal transmission path in the second direction, the second ground area and the third ground area respectively disposed on both sides of the second signal transmission path in the second direction, wherein the signal transmission paths and the respective pairs of signal lines are disposed in respective cutouts of the ground pattern and are in the same layer as the ground pattern, and are surrounded on all sides by the ground pattern, wherein the ground pattern includes a first side ground area connected with at least respective one end sides of the first ground area, the second ground area and the third ground area, wherein the ground through hole is disposed to connect the ground pattern with the ground layer, and wherein the first side ground area extends to a side of the rectangular ground pattern in the first direction and extends to the respective one end sides of the first ground area, the second ground area and the third ground are in the first direction.

\* \* \* \* \*